US008519718B2

(12) United States Patent
Kruse

(10) Patent No.: US 8,519,718 B2
(45) Date of Patent: Aug. 27, 2013

(54) TESTER FOR TESTING OPERATIONAL RELIABILITY OF A COCKPIT OXYGEN DISTRIBUTION CIRCUIT

(75) Inventor: Guenther Kruse, Hamburg (DE)

(73) Assignee: Airbus Operations GmbH, Hamburg (DE)

( * ) Notice: Subject to any disclaimer, the term of this patent is extended or adjusted under 35 U.S.C. 154(b) by 401 days.

(21) Appl. No.: 12/745,484

(22) PCT Filed: Nov. 29, 2007

(86) PCT No.: PCT/EP2007/010373
§ 371 (c)(1), (2), (4) Date: Sep. 29, 2010

(87) PCT Pub. No.: WO2009/068059
PCT Pub. Date: Jun. 4, 2009

(65) Prior Publication Data
US 2011/0006778 A1 Jan. 13, 2011

(51) Int. Cl.
*G01R 31/02* (2006.01)

(52) U.S. Cl.
USPC ............ 324/537; 324/503; 324/512; 324/523

(58) Field of Classification Search
USPC .................................................. 324/503–544
See application file for complete search history.

(56) References Cited

U.S. PATENT DOCUMENTS 4,002,972 A * 1/1977 Konrad et al. ................ 324/500
4,251,765 A * 2/1981 Mears ........................... 324/503
4,765,193 A * 8/1988 Holden et al. ............... 73/865.9
4,870,347 A * 9/1989 Cicerone ....................... 324/114
5,036,479 A * 7/1991 Prednis et al. ................ 702/121
5,071,453 A * 12/1991 Hradek et al. .................. 96/111

(Continued)

FOREIGN PATENT DOCUMENTS

FR 2 880 328 7/2006
WO WO 2004/011095 2/2004

OTHER PUBLICATIONS

International Search Report and Written Opinion, PCT/EP2007/010373, Airbus Deutschland GmbH, The International Searching Authority/European Patent Office, Sep. 9, 2008.

(Continued)

*Primary Examiner* — Huy Q Phan
*Assistant Examiner* — Adam Clarke
(74) *Attorney, Agent, or Firm* — Krieg DeVault LLP

(57) ABSTRACT

The present invention relates to a tester (100) for testing operational reliability of a cockpit oxygen distribution circuit (1) having a plurality of components (20, 30, 40, 50) ensuring supply of oxygen from the cockpit oxygen distribution circuit (1) to a cockpit crew of an aircraft in an emergency situation. The tester (100) comprises means (20', 30', 40', 500 for electrically connecting the tester (100), in place of at least one of the components (20, 30, 40, 50), to the cockpit oxygen distribution circuit (1), an indicator (120) for indicating that the electrical connection of the tester (100) to the cockpit oxygen distribution circuit (1) has been established in a pre-defined manner, and switching means (RL1, RL2, RL3, RL4) for initiating an output signal of the tester (100), wherein the output signal is indicative of an operating condition of the component (20, 30, 40, 50) when being connected to the cockpit oxygen distribution circuit (1). The invention further relates to the use of such a tester (100) and a method for testing operational reliability of a cockpit oxygen distribution circuit (1).

7 Claims, 4 Drawing Sheets

(56) References Cited

U.S. PATENT DOCUMENTS

| | | | | |
|---|---|---|---|---|
| 6,435,009 | B1 * | 8/2002 | Tilley | 73/40 |
| 6,820,616 | B1 | 11/2004 | Jordan | |
| 7,057,394 | B1 * | 6/2006 | Bell et al. | 324/503 |
| 7,176,811 | B1 * | 2/2007 | Parry | 340/945 |
| 7,204,249 | B1 | 4/2007 | Richey, II et al. | |
| 2004/0216742 | A1 | 11/2004 | Talty | |
| 2005/0145245 | A1 * | 7/2005 | Jordan | 128/202.11 |
| 2005/0182583 | A1 * | 8/2005 | Miyazaki et al. | 702/117 |
| 2005/0256662 | A1 * | 11/2005 | Alder | 702/119 |
| 2007/0125164 | A1 | 6/2007 | Zielinski et al. | |
| 2008/0047352 | A1 * | 2/2008 | Kurtz et al. | 73/753 |
| 2009/0165796 | A1 * | 7/2009 | Aubonnet et al. | 128/204.21 |

OTHER PUBLICATIONS

English language translation of Decision on Granting a Patent for Invention from the Russian Federal Service for Intellectual Property, Application No. 2010122497/12 (031997).

* cited by examiner

TESTER FOR TESTING OPERATIONAL RELIABILITY OF A COCKPIT OXYGEN DISTRIBUTION CIRCUIT

CROSS REFERENCE TO RELATED APPLICATIONS

The present application is a §371 national stage patent application of PCT/EP2007/010373, filed Nov. 29, 2007, which is incorporated herein by reference.

The present invention relates to a tester for testing operational reliability of a cockpit oxygen distribution circuit having a plurality of components ensuring supply of oxygen from the cockpit oxygen distribution circuit to a cockpit crew of an aircraft in an emergency situation.

BACKGROUND ART

The oxygen distribution circuit for the cockpit crew supplies oxygen to the cockpit of the aircraft in the event of the cabin pressure falling below a critical value. In modern aircrafts, the oxygen distribution circuit for the cockpit crew is separate from the oxygen distribution circuit for the passengers of the aircraft. Typically, the oxygen distribution circuit for the passengers includes a chemical source of oxygen, that is to say, upon the cabin pressure falling below the critical value, a chemical reaction is initiated as a result of which oxygen is created. Conversely, the cockpit oxygen distribution circuit uses oxygen bottles from which oxygen is supplied to the cockpit of to the aircraft in an emergency situation.

FIG. 1 shows an example of a cockpit crew oxygen distribution circuit. An oxygen bottle 10 is provided as the oxygen source. The oxygen bottle 10 is connected via conduits 5, 15 to masks 4 for the cockpit crew. These masks 4 are normally stored in storage boxes 3 from which they are released upon pressure drop inside the cockpit. A pressure gauge 20 is provided in the outlet of the oxygen bottle 10. Reference numeral 30 indicates a pressure regulator which regulates (reduces) the pressure of the gas provided by the oxygen bottle 10. An electromagnetic valve 40 is provided in order to start or terminate oxygen flow from the oxygen bottle 10. During normal operation of the aircraft, the electromagnetic valve 40 is normally open and can be closed by the cockpit crew via a switch provided inside the cockpit of the aircraft (see e.g. switch 44 in FIG. 4). Furthermore, a pressure switch 50 is provided in conduit 15. When the gas pressure inside conduit 15 drops below a predetermined value, the pressure switch 50 opens, thereby initiating a low pressure signal on a display inside the cockpit for alerting the cockpit crew that the gas pressure inside conduit 15 is no longer sufficient for providing the cockpit crew, in an emergency situation, with a sufficient amount of oxygen. It goes without saying that in an actual aircraft, a plurality of these oxygen bottles 10 are provided and that conduit 15 branches off towards these oxygen bottles 10. Conduit 13 is provided for discharging an overpressure overboard the aircraft.

The ground tests of an aircraft require a number of different tests to be conducted. These tests include testing, for example, the pressure gauge 20, the pressure regulator 30, the electromagnetic valve 40 and the pressure switch 50 with regard to correct connection of these components to the cockpit oxygen distribution circuit, that is to say whether these components are correctly connected to the signal lines leading to control means inside the cockpit. Moreover, it is important to check whether these components can be controlled as specified, and that, for example, the correct pressure that can be provided by the cockpit oxygen distribution circuit to the cockpit of the aircraft is displayed correctly on a display inside the cockpit.

It is therefore an object of the invention to provide a tester for testing operational reliability of a cockpit oxygen distribution circuit with which the electrical connection and the control of the various components of the cockpit oxygen distribution circuit can be tested for operational reliability.

SUMMARY

This and other objects are solved by a tester for testing operational reliability of a cockpit oxygen distribution circuit having a plurality of components ensuring supply of oxygen from the cockpit oxygen distribution circuit to a cockpit crew of an aircraft in an emergency situation. The tester according to the invention comprises means for electrically connecting the tester, in place of at least one of the components, to the oxygen distribution circuit, an indicator for indicating that the electrical connection of the tester to the cockpit oxygen distribution circuit has been established in a predefined manner, and switching means for initiating an output signal of the tester, wherein the output signal is indicative of an operation condition of the component when being connected to the cockpit oxygen distribution circuit.

The tester according to the invention is connected, in place of at least one of the components, to the cockpit oxygen distribution circuit. When connected, the tester indicates in a first step whether the tester is correctly connected. This indication is important because it indicates whether the components, after completion of the tests, can be correctly wired to the electronic control infrastructure of the cockpit oxygen distribution circuit. In a second step, switching means of the tester are initiated to simulate an output signal of the components (signals which would be outputted if the components were connected to the cockpit oxygen distribution circuit). This output signal of the tester is transported to a corresponding display inside the cockpit for ascertaining that the operating condition of the hypothetically connected components meets specified requirements. The tester according to the invention therefore provides a simple tool for simulating the electrical connections of the components of the cockpit oxygen distribution circuit and the correct functioning of these components.

In a preferred embodiment, the output signal is indicative of a predefined operating condition of the component. Because the tester can generate through the use of the switching means an output signal which is indicative of a predefined operating condition of the component that is simulated by the tester, particular emergency conditions can be simulated by the tester and the behavior of the individual components can be checked in such situations. The operational reliability of the components of the cockpit oxygen distribution circuit can therefore be uniquely determined on the basis of the output signals of the tester. The operational reliability can be verified by, for example, displaying the simulated oxygen bottle pressure on a display inside the cockpit and comparing this simulated oxygen bottle pressure with the actual pressure inside the oxygen bottle.

Preferably, the output signal of the tester corresponds to an output signal generated by the component when the component, now in place of the tester, is connected to the cockpit oxygen distribution circuit. Hence, the output signals are a direct and unambiguous measure of the actual operational characteristics of the components when the components are connected with the cockpit oxygen distribution circuit.

According to another embodiment, the means for electrically connecting the tester to the cockpit oxygen distribution circuit comprises a plurality of terminals each having an input and an output. Preferably, the plurality of terminals correspond to a plurality of terminals provided on corresponding components of the cockpit oxygen distribution circuit. In this way, the tester can easily be connected to the cockpit oxygen distribution circuit because of the terminals being provided on the tester are identical to the terminals being provided on the components, and therefore the use of adaptors is avoided. This greatly facilitates the use of the tester for conducting the operational reliability tests on the cockpit oxygen distribution circuit.

Preferably, the switching means of the tester comprises a plurality of relays. Furthermore, the relays, upon switching, preferably allocate output signals to outputs of different terminals. Hence, the number of relays required is reduced due to one relay accounting for simulating output signals which are indicative of operating conditions of several components of the cockpit oxygen distribution circuit.

In addition, the relays are preferably controllable by input signals received by the tester from control units located in the cockpit of the aircraft. It can easily be tested by actuating, for example, the electromagnetic valve via a corresponding switch provided inside the cockpit and, by using the tester, to simulate the pressure now acting upon the pressure regulator. This simulated pressure ought to initiate a corresponding pressure signal resulting in a particular pressure reading on a pressure gauge inside the cockpit. This pressure reading can be compared with comparative data in order to verify that the pressure reading is correct. If correct, the electrical control of the electromagnetic valve and the pressure regulator can be assumed to be as specified.

In another preferred embodiment, the indicator comprises a plurality of light emitting diodes. These light emitting diodes allow the user of the tester to immediately realize whether the electrical connection of the tester, and thus of a component, to the cockpit oxygen distribution circuit is not as specified. Preferably, each light emitting diode is connected to an input of the plurality of terminals. Another preferred embodiment provides that each light emitting diode is active upon applying a ground potential to the input of the terminals.

In yet another embodiment, the tester is connected to the cockpit oxygen distribution circuit, in place of a pressure regulator, an electromagnetic valve, an oxygen pressure gauge and a pressure switch. Thus, the electrical connection and control of the pressure regulator, the electromagnetic valve, the oxygen pressure gauge and the pressure switch can be tested with one single tester, all of which are essential components of a cockpit oxygen distribution circuit.

Preferably, the input and output signals of the tester are in the range of 0 Volts and 20 Volts DC.

Another aspect of the invention features the use of a tester for testing operational reliability of a cockpit oxygen distribution circuit having a plurality of components ensuring supply of oxygen from the cockpit oxygen distribution circuit to a cockpit crew of an aircraft in an emergency situation, wherein the tester is such as previously described.

A yet another aspect of the invention features a method for testing operational reliability of a cockpit oxygen distribution circuit having a plurality of components ensuring supply of oxygen from the cockpit oxygen distribution circuit to a cockpit crew of an aircraft in an emergency situation. The method according to the invention comprises the steps of electrically connecting the tester, in place of at least one of the components, to the cockpit oxygen distribution circuit, verifying by means of an indicator that the electrical connection of the tester to the cockpit oxygen distribution circuit has been established in a predefined manner, and initiating switching means for initiating an output signal of the tester, wherein the output signal is indicative of an operating condition of the component when being connected to the cockpit oxygen distribution circuit.

A preferred embodiment of the method according to the invention further comprises the step of verifying that the output signal is indicative of a predefined operating condition of the component when being connected to the cockpit oxygen distribution circuit, and if not, adjusting the cockpit oxygen distribution circuit until the output signal is indicative of the predefined operating condition of the component.

Other features and advantages of the invention will become apparent from the following detailed description of a preferred embodiment of the invention, thereby referring to the appended drawings.

DETAILED DESCRIPTION OF A PREFERRED EMBODIMENT

Figure 1:
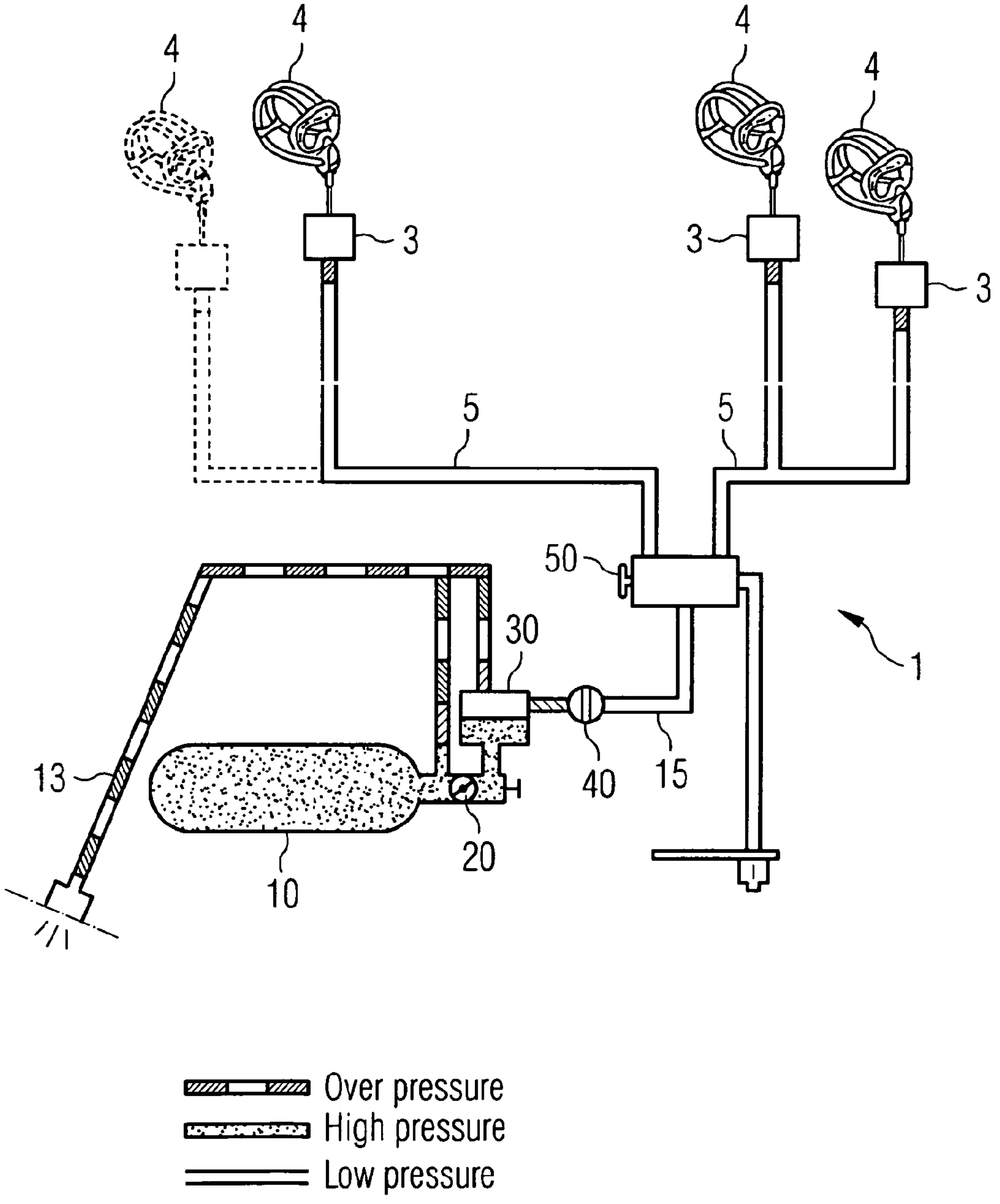
FIG. 1 is a schematic representation of an example of a cockpit oxygen distribution circuit installed onboard of an aircraft.

As already described with reference to FIG. 1, a cockpit oxygen distribution circuit requires frequent maintenance tests, thereby inspecting whether the individual components of the cockpit oxygen distribution circuit can be correctly connected to the electronic control infrastructure of the cockpit oxygen distribution circuit installed onboard of the aircraft. Once it has been established that the electrical connection of the components is as specified, it has to be verified, in addition, that control of the individual components via signal lines to and from these components to actuators, switches, displays etc. installed, for example, inside the cockpit of the aircraft is such that, in an emergency situation, the cockpit crew is supplied with sufficient oxygen from the cockpit oxygen distribution circuit. The tester according to the invention provides an easy and convenient way of conducting these tests.

Figure 2:
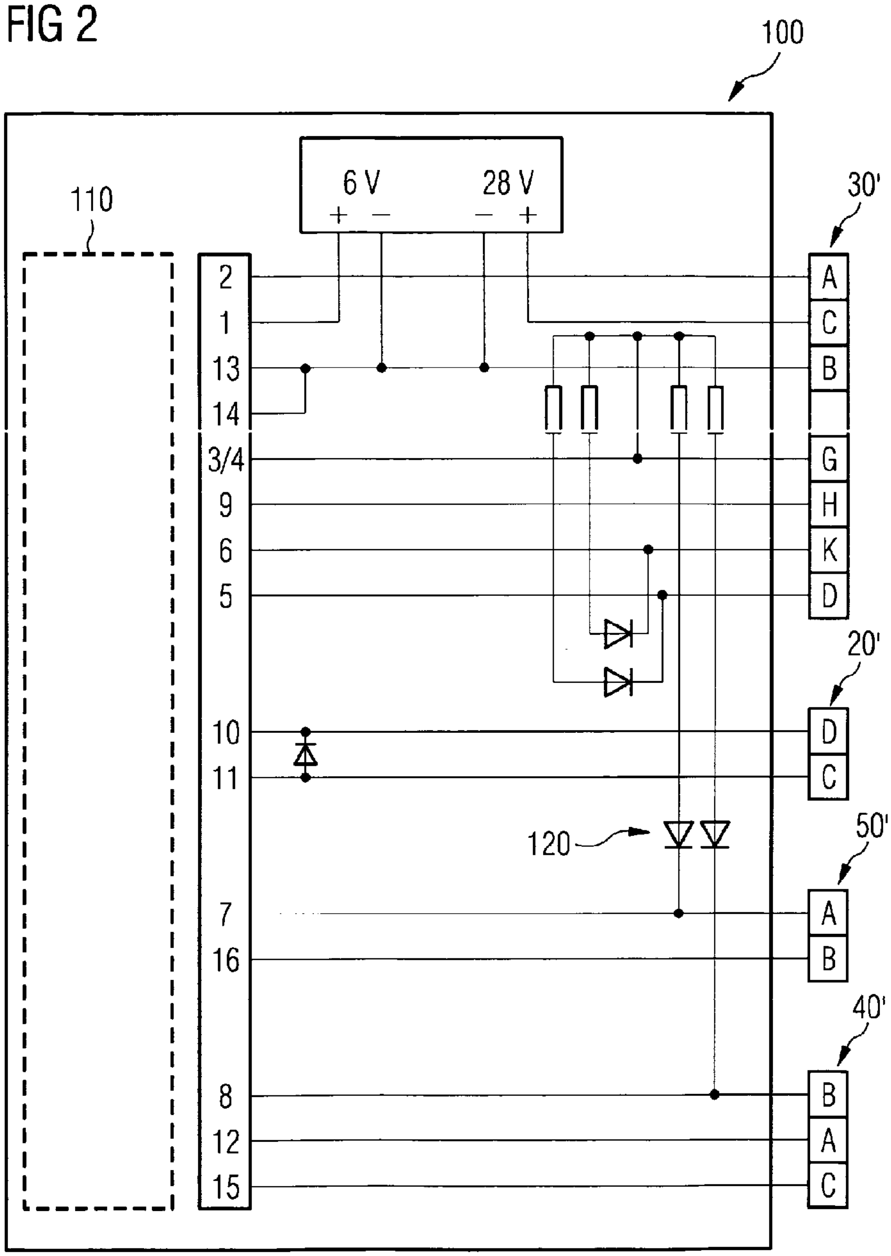
FIG. 2 is a wiring diagram of a tester according to the invention, showing terminals of the tester to be connected with terminals of the cockpit oxygen distribution circuit.

FIG. 2 is a wiring diagram of a tester 100 according to the invention. The tester comprises terminals 20', 30', 40', 50' which are to be connected to terminals of the electronic infrastructure of the cockpit oxygen distribution circuit 1 (see FIG. 1), in place of the components, such as the pressure gauge 20, pressure regulator 30, electromagnetic valve 40 and pressure switch 50 (see FIG. 1). In particular, terminal 30' is to be connected with a corresponding terminal of pressure regulator 30, terminal 20' is to be connected with a corresponding terminal of pressure gauge 20, terminal 50' is to be connected with a corresponding terminal of pressure switch 50 and terminal 40' is to be connected with a corresponding terminal of an electromagnetic valve 40. Thus, during ground tests of the aircraft, the individual components 20, 30, 40, 50 are replaced by the tester 100.

Tester 100 accommodates an electronic board 110 which will be described in detail with reference to FIG. 3. Furthermore, four light emitting diodes (LEDs) are provided for indicating whether each terminal 20', 30', 40', 50' is correctly connected to corresponding terminals of the cockpit oxygen distribution circuit. LEDs 120 are connected to respective signal lines of terminals 20', 30', 40', 50'. As can be seen in FIG. 2, LEDs 120 will be active upon connecting signals lines of contacts K, D of terminal 30', contact A of terminal 50' and contact B of terminal 40' to a ground potential. If all of the LEDs are active, the user of the tester 100 can be assured that the connection of the tester 100 to the respective terminals of the cockpit oxygen distribution circuit 1 is established as required. If one, or all, of the LEDs remain inactive, the connection is not as specified from which the user can infer that connecting the original components, such as the pressure regulator 30, to the cockpit oxygen distribution circuit will result in malfunctioning of that component. Hence, by means of LEDs 120, it can be ascertained that the wiring to and from the terminals of the cockpit oxygen distribution circuit is correct and that no signal lines are, for example, interrupted, short or faulty for some other reason.

Figure 3:
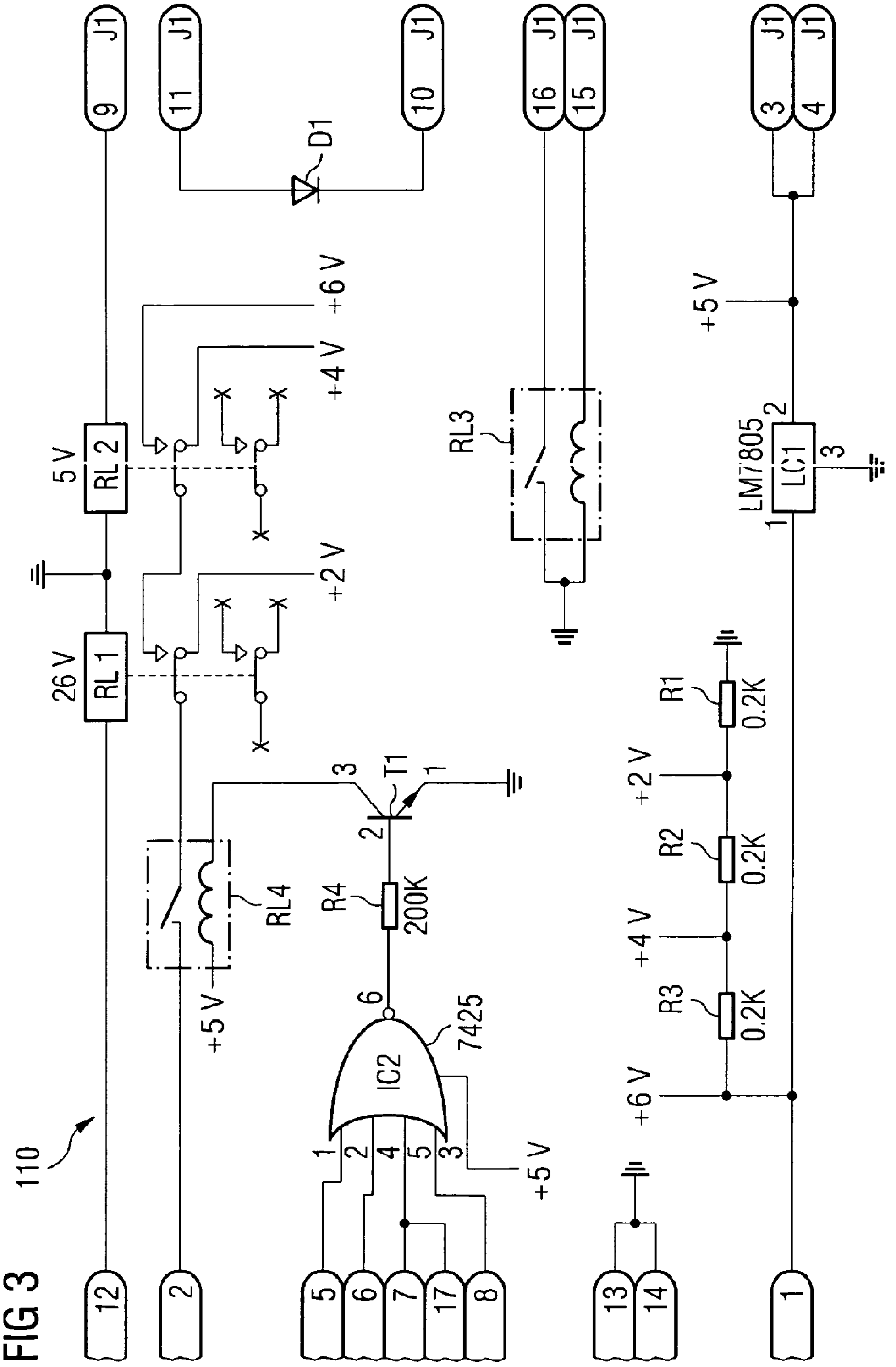
FIG. 3 is a wiring diagram of an electronic board provided inside the tester according to the invention.

With reference to FIG. 3, the electronic board indicated by reference numeral 110 in FIG. 2 is shown in detail. In the following, the electronic board of FIG. 3 will be explained, by way of example, in terms of its functions and which tests can be conducted on the cockpit oxygen distribution circuit using the tester 100. Three different tests will be described. It is pointed out that the tests given here by way of example are not exhaustive, and that other tests can be conducted using the tester 100. For the sake of the description of the three tests, it is assumed that upon connection of the tester 100 to the cockpit oxygen distribution circuit 1, all of the LEDs 120 of the tester 100 were active.

Upon connection of tester 100 with the cockpit oxygen distribution system, a current flow will be induced in transistor T1 as a consequence of which relay RL4 will be closed. Hence, a 2 V signal is applied to contact 2 which corresponds to contact A of terminal 30'. The 2 V output signal corresponds to a 2 Volt output signal normally generated by pressure regulator 30 during normal operation of the aircraft. This 2 V output signal effects a predefined oxygen pressure reading (x psi) being displayed on a display inside the cockpit of the aircraft. In other words, tester 100 simulates an output signal of pressure regulator 30 in order to verify that this output signal results in a correct oxygen pressure reading on the display inside the cockpit of the aircraft.

Figure 4:
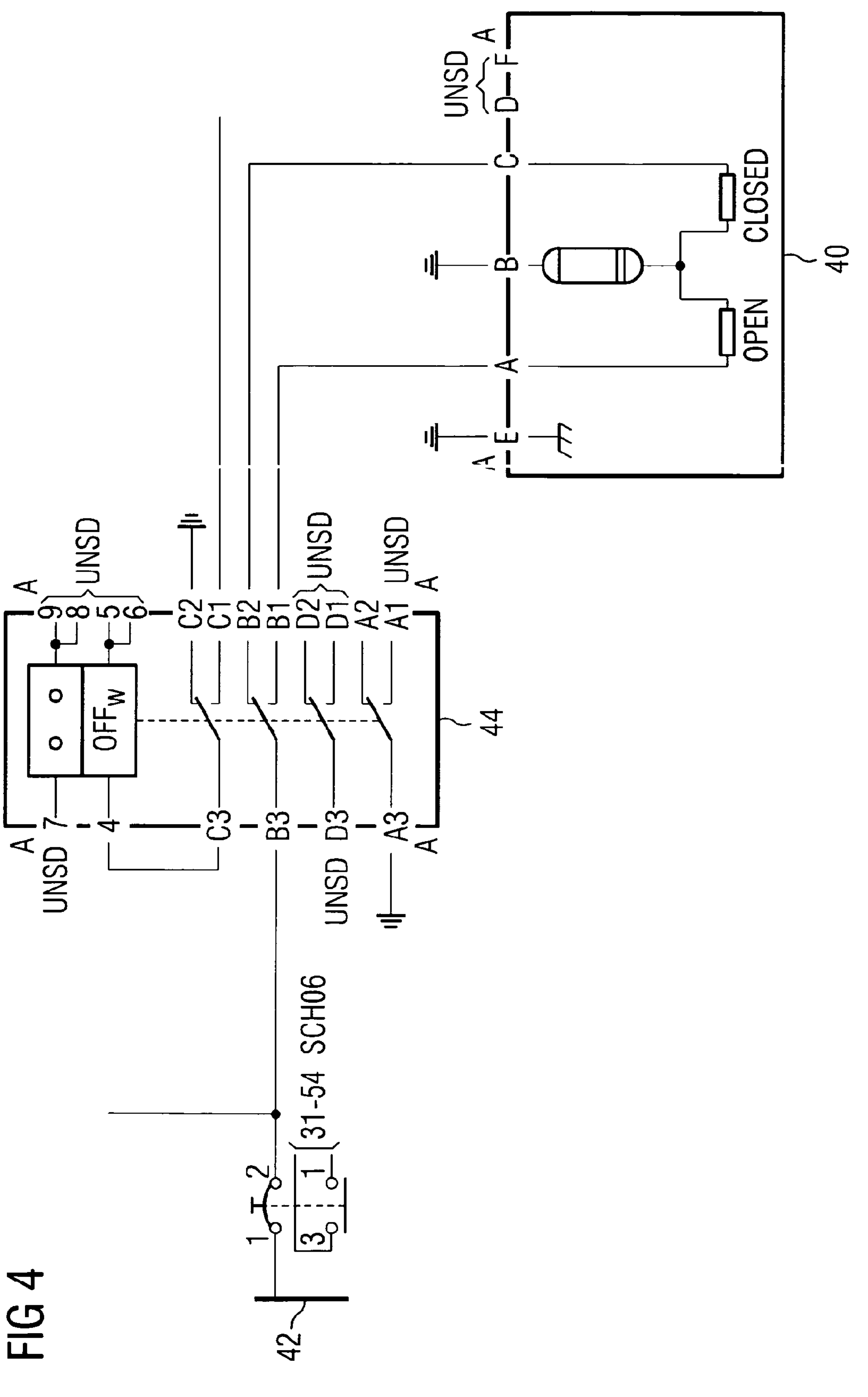
FIG. 4 shows, by way of example, control of an electromagnetic valve via a switch provided inside the cockpit of an aircraft.

A second exemplary test includes activation of switch 44 provided in the cockpit of the aircraft and establishing an operative connection between power supply 42 and switch 44 (see FIG. 4). Upon pressing switch 44, the voltage supplied by the power supply 42 (here 28 V) is applied to contact A of electromagnetic valve 40. With reference to FIG. 2, contact A of terminal 40' corresponds to contact 12 of the electronic board 110. Hence, a 28 V input signal on contact 12 (see FIG. 3) effects closing relay RL1, and hence a 4 V output signal is applied to contact 2 of the electronic board 110. Contact 2 corresponds to contact A of terminal 30' (see FIG. 2). Thus, a 4 V output signal is applied to contact of A of terminal 30'. The 4 V output signal is normally generated by the pressure regulator 30 during normal operation of the aircraft. The 4 V output signal on contact A of terminal 30' will effect another oxygen pressure reading (y psi) being displayed on a display inside the cockpit of the aircraft. If the oxygen pressure reading is correct, it is ascertained that the electrical wiring and control of the pressure regulator 30 is as specified. Furthermore, it can be tested whether the output signal generated during normal operation of the aircraft by the pressure regulator effects a correct oxygen pressure reading on the display inside the cockpit.

As a third exemplary test, switch 44 is manually opened thereby maintaining operative connection to power supply 42. In the open state of switch 44, the voltage of the power supply 42 (28 V) is applied to contact C of electromagnetic valve 40 (see FIG. 4). Contact C of electromagnetic valve 40 corresponds to contact 15 of electronic board 110 (see FIG. 2). A 28 V input signal on contact 15 results in closing relay RL3, thus connecting contact 16 with the ground potential. Consequently, contact B of terminal 50' is at ground potential which effects a low oxygen pressure alarm inside the cockpit. If the third exemplary test results in an alarm inside the cockpit, it is ascertained that the electrical wiring up to contact C of terminal 40' (and thus of electromagnetic valve 40) is as specified. At the same time, it can be verified that the pressure switch 50 outputs a correct output signal during normal operation of the aircraft by verifying whether a corresponding alarm signal is initiated inside the cockpit of the aircraft.

The essence of the invention is to provide an easy and convenient way of testing a plurality of components of a cockpit oxygen distribution circuit installed onboard of an aircraft. Instead of testing the components themselves, the components are withdrawn from the cockpit oxygen distribution circuit, and terminals of a tester according to the invention are connected to the terminals of the cockpit oxygen distribution circuit to which the plurality of components are normally connected.

By having provided on the tester corresponding indicators, LEDs in the preferred embodiment, it can easily be verified that the electrical wiring of the electronic control infrastructure of the cockpit oxygen distribution circuit up to the terminals of the components is as specified. Once the correct wiring scheme has been established, various tests can be conducted in order to simulate by the tester output signals of the various components in order to verify that these output signals effect, for example, corresponding oxygen pressure readings on a display inside the cockpit. Hence, the tester according to the invention greatly simplifies the ground tests of an aircraft, in particular with respect to tests of the operational reliability of the cockpit oxygen distribution circuit.

The invention claimed is:

1. Tester for testing operational reliability of a cockpit oxygen distribution circuit having a plurality of components ensuring supply of oxygen from the cockpit oxygen distribution circuit to a cockpit crew of an aircraft in an emergency situation, comprising:

means for electrically connecting the tester, in place of at least one of the components, to the cockpit oxygen distribution circuit, wherein the means for electrically connecting the tester to the cockpit oxygen distribution circuit comprises a plurality of terminals each having an input and an output, the plurality of terminals corresponding to a plurality of terminals provided on corresponding components of the cockpit oxygen distribution circuit, an indicator for indicating that the electrical connection of the tester to the cockpit oxygen distribution circuit has been established in a predefined manner, wherein the indicator comprises a plurality of light emitting diodes, each light emitting diode connected to an input of the plurality of terminals, and active upon applying a ground potential to the input of the terminals, and switching means for initiating an output signal of the tester, the output signal of the tester simulating an output signal of the component replaced by the tester and being indicative of an operating condition of the component when being connected to the cockpit oxygen distribution circuit.

2. Tester according to claim 1, wherein the output signal is indicative of a predefined operating condition of the component.

3. Tester according to claim 1, wherein the switching means comprises a plurality of relays.

4. Tester according to claim 3, wherein the relays, upon switching, allocate output signals to outputs of different terminals.

5. Tester according to claim 4, wherein the relays are controllable by input signals received by the tester from control units located in the cockpit of the aircraft.

6. Tester according to claim 1, wherein the tester is connected to the cockpit oxygen distribution circuit, in place of a pressure regulator, an electromagnetic valve, an oxygen pressure gauge and a pressure switch.

7. Tester according to claim 1, wherein input and output signals of the tester are in the range of 0V and 28V DC.

* * * * *